(12) United States Patent
Liu et al.

(10) Patent No.: US 10,319,788 B2
(45) Date of Patent: Jun. 11, 2019

(54) CONNECT DEVICE AND ORGANIC LIGHT EMITTING DEVICE

(71) Applicant: Shenzhen China Star Optoelectronics Technology Co., Ltd., Shenzhen, Guangdong (CN)

(72) Inventors: Zhongjie Liu, Guangdong (CN); Gege Zhou, Guangdong (CN); Lingyan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 251 days.

(21) Appl. No.: 14/652,151

(22) PCT Filed: Apr. 22, 2015

(86) PCT No.: PCT/CN2015/077184
§ 371 (c)(1),
(2) Date: Jun. 15, 2015

(87) PCT Pub. No.: WO2016/155058
PCT Pub. Date: Oct. 6, 2016

(65) Prior Publication Data
US 2017/0040387 A1    Feb. 9, 2017

(30) Foreign Application Priority Data

Apr. 2, 2015  (CN) .......................... 2015 1 0154110

(51) Int. Cl.
*H01L 27/32* (2006.01)
*H01L 23/538* (2006.01)
*H01L 51/52* (2006.01)

(52) U.S. Cl.
CPC ...... *H01L 27/3204* (2013.01); *H01L 23/5386* (2013.01); *H01L 51/5203* (2013.01); *H01L 51/5206* (2013.01); *H01L 51/5221* (2013.01)

(58) Field of Classification Search
CPC ............. H01L 27/3204; H01L 51/5221; H01L 51/5206; H01L 23/5386
See application file for complete search history.

(56) References Cited

U.S. PATENT DOCUMENTS

| 2013/0056721 A1* | 3/2013 | Sakagushi | ........... H01L 27/3202 257/40 |
| 2014/0097423 A1* | 4/2014 | Lee | ..................... H01L 27/3204 257/40 |

* cited by examiner

*Primary Examiner* — Mohammed R Alam
(74) *Attorney, Agent, or Firm* — Andrew C. Cheng

(57) ABSTRACT

Disclosed is a connect device, having a substrate, a connect electrode, a first to third pairs of electrodes, and the connect electrode, the first to third pairs of electrodes are paved on the substrate, and the first to third pairs of electrodes have anodes and cathodes, and the anodes of the first to third pairs of electrodes are respectively employed to connect a power supply, the anodes of the first, second organic light emitting elements, and the cathodes of the first to third pairs of electrodes are respectively employed to connect the power supply, the cathodes of the first, second organic light emitting elements for respectively and simultaneously supplying power to the first, second organic light emitting elements with the power supply. The application satisfies brightness demands to the light devices without increasing additional power consumption. An organic light emitting device is further provided.

10 Claims, 2 Drawing Sheets

CONNECT DEVICE AND ORGANIC LIGHT EMITTING DEVICE

CROSS REFERENCE

This application claims the priority of Chinese Patent Application No. 201510154110.8, entitled "Connect device and organic light emitting device", filed on Apr. 2, 2015, the disclosure of which is incorporated herein by reference in its entirety.

FIELD OF THE INVENTION

The present invention relates to an electronic technology field, and more particularly to a connect device and an organic light emitting device.

BACKGROUND OF THE INVENTION

With the rapid development of display industry and lighting industry, the brightness demands in the display industry and lighting industry have significantly raised. When the brightness of one single light emitting element is not enough, another light emitting element can be connected in series for increasing the brightness. Connecting another light emitting element in series can increase the light emitting area, however, the areal resistance of the light emitting elements is increased, accordingly. Because the areal resistance of the light emitting elements is increased, the lost voltage on the light emitting area is increased and thus, the power consumption is increased. Meanwhile, the increase of the light emitting area can cause heating phenomenon which is more serious. The usage reliability of the light emitting elements will be severely influenced.

SUMMARY OF THE INVENTION

An objective of the present invention is to provide a connect device and an organic light emitting device, satisfying the brightness demands in the industry to the light devices without increasing the areal resistance but increasing the light emitting area.

The present invention further provides a voltage output system.

For realizing the aforesaid objective, the technical solution provided by the embodiments of the present invention is:

the present invention provides a connect device, employed to connect an organic light emitting element, wherein the connect device comprises a substrate, a connect electrode, a first pair of electrodes, a second pair of electrodes and a third pair of electrodes, and all the connect electrode, the first to the third pairs of electrodes are paved on the substrate, and all the first to the third pairs of electrodes comprise anodes and cathodes, and all the anodes are electrically connected via the connect electrode, and all the cathodes are electrically connected via the connect electrode, and the anode of the first pair of electrodes is employed to connect a positive electrode of a power supply, and the cathode of the first pair of electrodes is employed to connect a negative electrode of the power supply, and the anode of the second pair of electrodes is employed to connect an anode of a first organic light emitting element, and the cathode of the second pair of electrodes is employed to connect a cathode of the first organic light emitting element, and the anode of the third pair of electrodes is employed to connect an anode of a second organic light emitting element, and the cathode of the third pair of electrodes is employed to connect a cathode of the second organic light emitting element for respectively and simultaneously supplying power to the first and the second organic light emitting elements with the power supply.

The connect electrode comprises a first side and a second side which are oppositely positioned, and both the first and the second pairs of electrodes are positioned at the first side of the connect electrode, and the third pair of electrodes are positioned at the second side of the connect electrode.

Appearances of the substrate and the connect electrode are the same, and respective edges of the connect electrode are parallel with corresponding edges of the substrate.

The present invention further provides an organic light emitting device, comprising a power supply, a first organic light emitting element, a second organic light emitting element and a connect device, and the connect device comprises a substrate, a connect electrode, a first pair of electrodes, a second pair of electrodes and a third pair of electrodes, and all the connect electrode, the first to the third pairs of electrodes are paved on the substrate, and all the first to the third pairs of electrodes comprise anodes and cathodes, and all the anodes are electrically connected via the connect electrode, and all the cathodes are electrically connected via the connect electrode, and the anode of the first pair of electrodes is employed to connect a positive electrode of the power supply, and the cathode of the first pair of electrodes is employed to connect a negative electrode of the power supply, and the anode of the second pair of electrodes is employed to connect an anode of the first organic light emitting element, and the cathode of the second pair of electrodes is employed to connect a cathode of the first organic light emitting element, and the anode of the third pair of electrodes is employed to connect an anode of the second organic light emitting element, and the cathode of the third pair of electrodes is employed to connect a cathode of the second organic light emitting element for respectively and simultaneously supplying power to the first and the second organic light emitting elements with the power supply.

The connect electrode comprises a first side and a second side which are oppositely positioned, and both the first and the second pairs of electrodes are positioned at the first side of the connect electrode, and the third pair of electrodes are positioned at the second side of the connect electrode.

Appearances of the substrate and the connect electrode are the same, and respective edges of the connect electrode are parallel with corresponding edges of the substrate.

Both the first and the second organic light emitting elements comprise a first electrode, a second electrode and a coupling electrode, and the first electrode, the second electrode and the coupling electrode are electrically connected in sequence to form a circuit, and the first electrodes of the first and the second organic light emitting elements are employed to be anodes of the first and the second organic light emitting elements, and the coupling electrodes of the first and the second organic light emitting elements are employed to be cathodes of the first and the second organic light emitting elements.

The first electrode comprises a first connect terminal which is extendable, and the coupling electrode comprises a second connect terminal which is extendable, and the anodes of the first and the second organic light emitting elements are connected to the anodes of the second pair of the electrodes via the first connect terminal, and the cathodes of the first and the second organic light emitting elements are connected to the cathodes of the third pair of electrodes via the second connect terminal.

The first and the second connect terminals are forms of wire with cover, metal plate or metal belt.

The power supply is a constant current driver.

the present invention provides a connect device, employed to connect an organic light emitting element, wherein the connect device comprises a substrate, a connect electrode, a first pair of electrodes, a second pair of electrodes and a third pair of electrodes, and all the connect electrode, the first to the third pairs of electrodes are paved on the substrate, and all the first to the third pairs of electrodes comprise anodes and cathodes, and all the anodes are electrically connected via the connect electrode, and all the cathodes are electrically connected via the connect electrode, and the anodes of the first pair of electrodes are employed to connect a positive electrode of a power supply, and the cathodes of the first pair of electrodes are employed to connect a negative electrode of the power supply, and the anodes of the second pair of electrodes are employed to connect an anode of a first organic light emitting element, and the cathodes of the second pair of electrodes are employed to connect a cathode of the first organic light emitting element, and the anodes of the third pair of electrodes are employed to connect an anode of a second organic light emitting element, and the cathodes of the third pair of electrodes are employed to connect a cathode of the second organic light emitting element for respectively and simultaneously supplying power to the first and the second organic light emitting elements with the power supply. Therefore, the present invention can increase the amount of organic light emitting elements in the connect device to increase the light emitting area but not increase the areal resistance. Thus, the present invention can satisfy brightness demands to the light emitting devices without increasing additional power consumption.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

Figure 1:
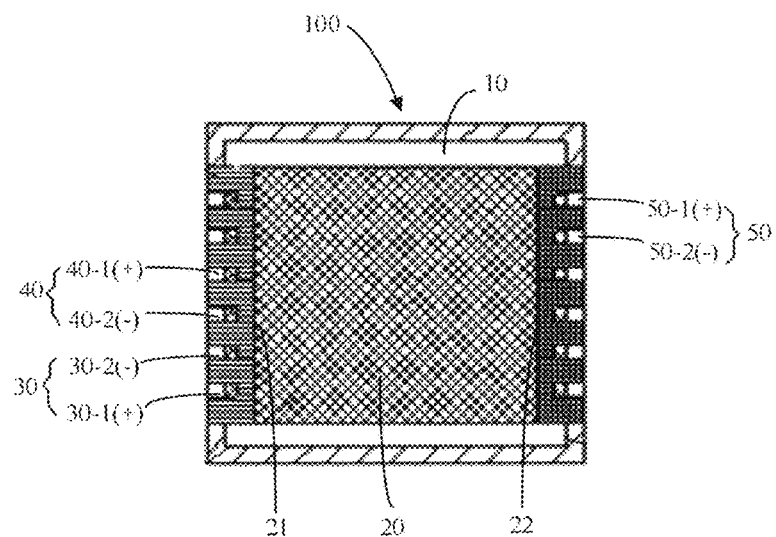
FIG. 1 is a diagram of a connect device provided by the first preferred embodiment of the first solution according to the present invention.

For better explaining the technical solution and the effect of the present invention, the present invention will be further described in detail with the accompanying drawings in the specific embodiments.

It will be understood that when an element or layer is referred to as being "on", "connected to" or "coupled to" another element or layer, it can be directly on the other element or layer or intervening elements or layers may be present. In contrast, when an element is referred to as being "directly on", "directly connected to" or "directly coupled to" another element or layer, there are no intervening elements or layers present. Like numbers indicate like elements throughout. As used herein, the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "below", "beneath", "lower", "above", "upper" and the like, may be used herein for ease of description to describe one element or feature's relationship to another element(s) or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Please refer to FIG. 1. The preferred embodiment of the first solution according to the present invention provides a connect device 100. The connect device 100 is employed to connect an organic light emitting element. The connect device 100 comprises a substrate 10, a connect electrode 20, a first pair of electrodes 30, a second pair of electrodes 40 and a third pair of electrodes 50. All the connect electrode 20, the first to the third pairs of electrodes 30-50 are paved on the substrate 10. All the first to the third pairs of electrodes 30-50 comprise anodes and cathodes. All the anodes are electrically connected via the connect electrode 20. All the cathodes are electrically connected via the connect electrode 20. The anode 30-1 of the first pair of electrodes 30 is employed to connect a positive electrode of a power supply (not shown). The cathode 30-2 of the first pair of electrodes 30 is employed to connect a negative electrode of the power supply. The anode 40-1 of the second pair of electrodes 40 is employed to connect an anode of a first organic light emitting element (not shown). The cathode 40-2 of the second pair of electrodes 40 is employed to connect a cathode of the first organic light emitting element. The anode 50-1 of the third pair of electrodes 50 is employed to connect an anode of a second organic light emitting element. The cathode 50-2 of the third pair of electrodes 50 is employed to connect a cathode of the second organic light emitting element for respectively and simultaneously supplying power to the first and the second organic light emitting elements with the power supply.

Specifically, in this embodiment, the connect device 100 comprises the first to the third pairs of electrodes 30-50. In other embodiments, the amount of the pairs of electrodes of the connect device 100 can be adjusted according to the actual demands.

In this embodiment, the connect device 100 comprises a substrate 10, a connect electrode 20, a first pair of electrodes 30, a second pair of electrodes 40 and a third pair of electrodes 50. All the connect electrode 20, the first to the third pairs of electrodes 30-50 are paved on the substrate 10. All the first to the third pairs of electrodes 30-50 comprise anodes and cathodes. All the anodes are electrically connected via the connect electrode 20. All the cathodes are electrically connected via the connect electrode 20. The anode 30-1 of the first pair of electrodes 30 is employed to connect a positive electrode of a power supply (not shown). The cathode 30-2 of the first pair of electrodes 30 is employed to connect a negative electrode of the power supply. The anode 40-1 of the second pair of electrodes 40 is employed to connect an anode of a first organic light emitting element (not shown). The cathode 40-2 of the second pair of electrodes 40 is employed to connect a cathode of the first organic light emitting element. The anode 50-1 of the third pair of electrodes 50 is employed to connect an anode of a second organic light emitting element. The cathode 50-2 of the third pair of electrodes 50 is employed to connect a cathode of the second organic light emitting element for respectively and simultaneously supplying power to the first and the second organic light emitting elements with the power supply. Therefore, the present invention can increase the amount of organic light emitting elements in the connect device 100 to increase the light emitting area but not increase the areal resistance. Thus, the present invention can satisfy brightness demands to the light emitting devices without increasing additional power consumption.

Furthermore, the connect electrode 20 comprises a first side 21 and a second side 22 which are oppositely positioned. Both the first and the second pairs of electrodes 30, 40 are positioned at the first side 21 of the connect electrode 20. The third pair of electrodes 50 are positioned at the second side 22 of the connect electrode 20.

In this embodiment, both the first and the second pairs of electrodes 30, 40 are positioned at the first side 21 of the connect electrode 20. The third pair of electrodes 50 are positioned at the second side 22 of the connect electrode 20. In other embodiments, the positions of the first to the third pairs of electrodes 30-50 can be adjusted according to the actual demands as long as they are connected to the connect electrode 20.

Furthermore, the appearances of the substrate 10 and the connect electrode 20 are the same, and respective edges of the connect electrode 20 are parallel with corresponding edges of the substrate 20.

Specifically, the substrate 10 is rectangle. The connect electrode 20 is rectangle. The appearances of the substrate 10 and the connect electrode 20 can be adjusted according to the actual demands.

Figure 2:
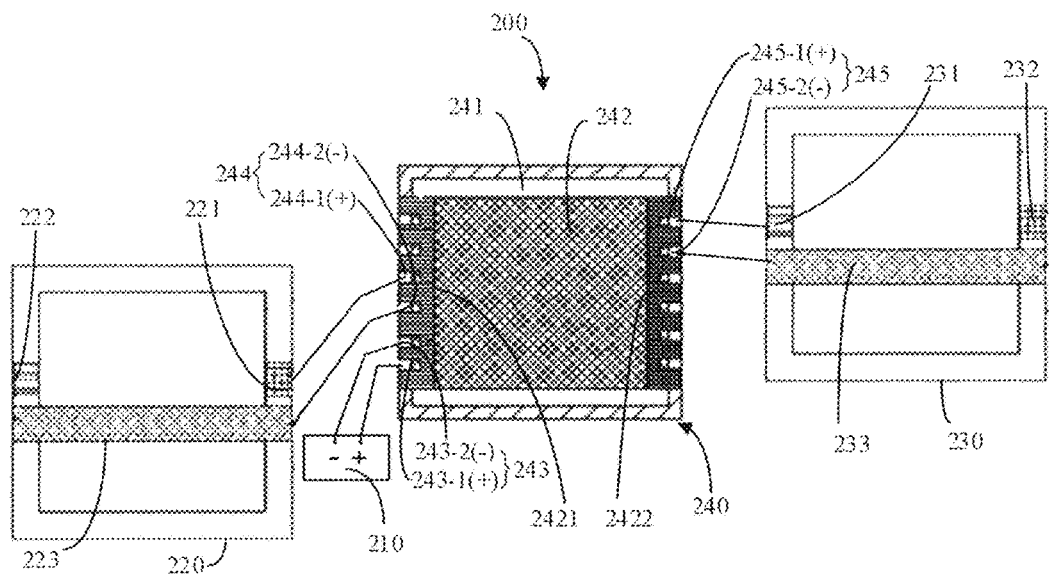
FIG. 2 is a diagram of an organic light emitting device provided by the first preferred embodiment of the second solution according to the present invention.

Please refer to FIG. 2. The first preferred embodiment of the second solution according to the present invention provides an organic light emitting device 200. The organic light emitting device 200 comprises a power supply 210, a first organic light emitting element 220, a second organic light emitting element 230 and a connect device 240. The connect device 240 comprises a substrate 241, a connect electrode 242, a first pair of electrodes 243, a second pair of electrodes 244 and a third pair of electrodes 245. All the connect electrode, the first to the third pairs of electrodes 243-245 are paved on the substrate 241. All the first to the third pairs of electrodes 243-245 comprise anodes and cathodes. All the anodes are electrically connected via the connect electrode 242. All the cathodes are electrically connected via the connect electrode 242. The anode 243-1 of the first pair of electrodes 243 connects a positive electrode of a power supply 210. The cathode 243-2 of the first pair of electrodes 243 connects a negative electrode of the power supply 210. The anode 244-1 of the second pair of electrodes 244 connects an anode of a first organic light emitting element 220. The cathode 244-2 of the second pair of electrodes 244 connects a cathode of the first organic light emitting element 220. The anode 245-1 of the third pair of electrodes 245 connects an anode of a second organic light emitting element 230. The cathode 245-2 of the third pair of electrodes 245 connects a cathode of the second organic light emitting element 230 for respectively and simultaneously supplying power to the first and the second organic light emitting elements 220, 230 with the power supply 210.

Specifically, in this embodiment, the connect device 240 comprises the first to the third pairs of electrodes 243-245. The light emitting device 200 comprises the first and the second organic light emitting element 220, 230. The power supply 210 is a constant current driver.

In other embodiments, the amount of the pairs of electrodes of the connect device 240 can be adjusted according to the actual demands. The amount of the organic light emitting elements of the light emitting device 200 can be adjusted according to the actual demands.

In this embodiment, the organic light emitting device 200 comprises a power supply 210, a first organic light emitting element 220, a second organic light emitting element 230 and a connect device 240. The connect device 240 comprises a substrate 241, a connect electrode 242, a first pair of electrodes 243, a second pair of electrodes 244 and a third pair of electrodes 245. All the connect electrode, the first to the third pairs of electrodes 243-245 are paved on the substrate 241. All the first to the third pairs of electrodes 243-245 comprise anodes and cathodes. All the anodes are electrically connected via the connect electrode 242. All the cathodes are electrically connected via the connect electrode 242. The anode 243-1 of the first pair of electrodes 243 connects a positive electrode of a power supply 210. The cathode 243-2 of the first pair of electrodes 243 connects a negative electrode of the power supply 210. The anode 244-1 of the second pair of electrodes 244 connects an anode of a first organic light emitting element 220. The cathode 244-2 of the second pair of electrodes 244 connects a cathode of the first organic light emitting element 220. The anode 245-1 of the third pair of electrodes 245 connects an anode of a second organic light emitting element 230. The cathode 245-2 of the third pair of electrodes 245 connects a cathode of the second organic light emitting element 230 for respectively and simultaneously supplying power to the first and the second organic light emitting elements 220, 230 with the power supply 210.Therefore, the organic light emitting device 200 can increase the amount of organic light emitting elements in the connect device 240 to increase the light emitting area but the organic light emitting device 200 does not increase the areal resistance. Thus, the present invention can satisfy brightness demands to the light emitting devices without increasing additional power consumption.

Furthermore, the connect electrode 242 comprises a first side 2421 and a second side 2422 which are oppositely positioned. Both the first and the second pairs of electrodes 243, 244 are positioned at the first side 2421 of the connect electrode 242. The third pair of electrodes 245 are positioned at the second side 2422 of the connect electrode 242.

In this embodiment, both the first and the second pairs of electrodes 30, 40 are positioned at the first side 21 of the connect electrode 20. The third pair of electrodes 50 are positioned at the second side 22 of the connect electrode 20. In other embodiments, the positions of the first to the third pairs of electrodes 30-50 can be adjusted according to the actual demands as long as they are connected to the connect electrode 20.

Furthermore, the first organic light emitting element 220 comprises a first electrode 221, a second electrode 222 and a coupling electrode 223. The second organic light emitting element 230 comprises a first electrode 221, a second electrode 222 and a coupling electrode 223. For the first organic light emitting element 220, the first electrode 221, the second electrode 222 and the coupling electrode 223 are electrically connected in sequence to form a circuit. For the second organic light emitting element 230, the first electrode 231, the second electrode 232 and the coupling electrode 233 are electrically connected in sequence to form a circuit. The first electrode 221 of the first organic light emitting element 220 is employed as being the anode of the first organic light emitting element 220. The first electrode 231 of the second organic light emitting element 230 is employed as being the anode of the second organic light emitting element 230. The coupling electrode 223 of the first organic light emitting element 220 is employed as being the cathode of the first organic light emitting element 220.The coupling electrode 233 of the second organic light emitting element 230 is employed as being the cathode of the second organic light emitting element 230.

Furthermore, the appearances of the substrate 10 and the connect electrode 20 are the same, and respective edges of the connect electrode 20 are parallel with corresponding edges of the substrate 20.

Specifically, the substrate 10 is rectangle. The connect electrode 20 is rectangle. The appearances of the substrate 10 and the connect electrode 20 can be adjusted according to the actual demands.

Figure 3:
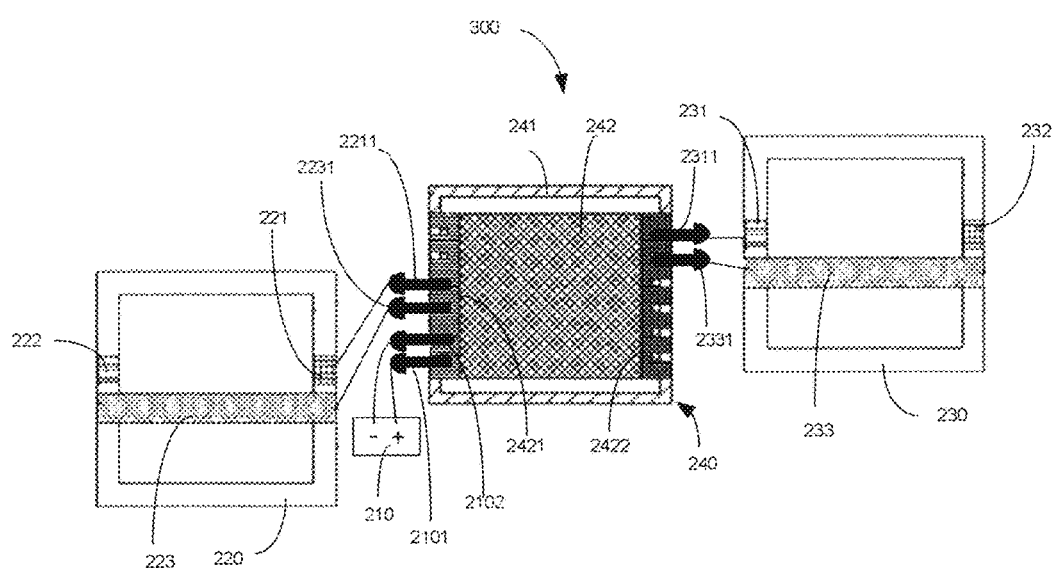
FIG. 3 is a diagram of an organic light emitting device provided by the second preferred embodiment of the second solution according to the present invention.

Please refer to FIG. 3. The second preferred embodiment of the second solution according to the present invention provides an organic light emitting device 300. The organic light emitting device 300 provided by the second preferred embodiment is similar with the organic light emitting device 200 provided by the first preferred embodiment. The difference between the two is: in the second preferred embodiment, the first electrodes 221, 231 respectively comprise first connect terminals 2211, 2311 which are extendable. The coupling electrodes 223, 233 respectively comprise second connect terminals 2231, 2331 which are extendable. The anodes of the first and the second organic light emitting elements 220, 230 are respectively connected to the anodes of the second pair of the electrodes 244 via the first connect terminal 2211, 2311. The cathodes of the first and the second organic light emitting elements 220, 230 are respectively connected to the cathodes of the third pair of the electrodes 245 via the second connect terminal 2231, 2331.

Furthermore, the power supply 210 comprises a first connect terminal 2101 and a second connect terminal 2102. The first connect terminal 2101 of the power supply 210 is connected to the anodes of the first pair of the electrodes 243.The second connect terminal 2102 of the power supply 210 is connected to the cathodes of the first pair of the electrodes 243.

The first connect terminals 2211, 2311, 2101 and the second connect terminals 2231, 2331, 2102 are forms of wire with cover, metal plate or metal belt.

In this embodiment, the first electrode 221, 231 respectively comprise the first connect terminals 2211, 2311 which are extendable. The coupling electrodes 223, 233 respectively comprise second connect terminals 2231, 2331 which are extendable. The anodes of the first and the second organic light emitting elements 220, 230 are respectively connected to the anodes of the second pair of the electrodes 244 via the first connect terminal 2211, 2311. The cathodes of the first and the second organic light emitting elements 220, 230 are respectively connected to the cathodes of the third pair of the electrodes 245 via the second connect terminal 2231, 2331. Accordingly, the organic light emitting device 300 is beneficial for the detachment of the organic light emitting elements.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A connect device, employed to connect a first organic light emitting element and a second organic light emitting element, wherein the connect device comprises a substrate, a connect electrode, a first pair of electrodes, a second pair of electrodes and a third pair of electrodes, and all the connect electrode, the first to the third pairs of electrodes are paved on the substrate, and all the first to the third pairs of electrodes comprise anodes and cathodes, and all the anodes are electrically connected via the connect electrode, and all the cathodes are electrically connected via the connect electrode, and the anode of the first pair of electrodes is employed to connect a positive electrode of a power supply, and the cathode of the first pair of electrodes is employed to connect a negative electrode of the power supply, and the anode of the second pair of electrodes is employed to connect an anode of the first organic light emitting element, and the cathode of the second pair of electrodes is employed to connect a cathode of the first organic light emitting element, and the anode of the third pair of electrodes is employed to connect an anode of the second organic light emitting element, and the cathode of the third pair of electrodes is employed to connect a cathode of the second organic light emitting element for connecting the first and the second organic light emitting elements in parallel with the power supply and respectively and simultaneously supplying power to the first and the second organic light emitting elements with the power supply to increase a light emitting area without increasing an areal resistance of the first and the second organic light emitting elements by connecting the first and the second organic light emitting elements in parallel.

2. The connect device according to claim 1, wherein the connect electrode comprises a first side and a second side which are oppositely positioned, and both the first and the second pairs of electrodes are positioned at the first side of the connect electrode, and the third pair of electrodes are positioned at the second side of the connect electrode.

3. The connect device according to claim 1, wherein appearances of the substrate and the connect electrode are the same, and respective edges of the connect electrode are parallel with corresponding edges of the substrate.

4. An organic light emitting device, comprising a power supply, a first organic light emitting element, a second organic light emitting element and a connect device, and the connect device comprises a substrate, a connect electrode, a first pair of electrodes, a second pair of electrodes and a third pair of electrodes, and all the connect electrode, the first to the third pairs of electrodes are paved on the substrate, and all the first to the third pairs of electrodes comprise anodes and cathodes, and all the anodes are electrically connected via the connect electrode, and all the cathodes are electrically connected via the connect electrode, and the anode of the first pair of electrodes is employed to connect a positive electrode of the power supply, and the cathode of the first pair of electrodes is employed to connect a negative electrode of the power supply, and the anode of the second pair of electrodes is employed to connect an anode of the first organic light emitting element, and the cathode of the second pair of electrodes is employed to connect a cathode of the first organic light emitting element, and the anode of the third pair of electrodes is employed to connect an anode of the second organic light emitting element, and the cathode of the third pair of electrodes is employed to connect a cathode of the second organic light emitting element for connecting the first and the second organic light emitting elements in parallel with the power supply and respectively and simultaneously supplying power to the first and the second organic light emitting elements with the power supply to increase a light emitting area without increasing an areal resistance of the first and the second organic light emitting elements by connecting the first and the second organic light emitting elements in parallel.

5. The organic light emitting device according to claim 4, wherein the connect electrode comprises a first side and a second side which are oppositely positioned, and both the first and the second pairs of electrodes are positioned at the first side of the connect electrode, and the third pair of electrodes are positioned at the second side of the connect electrode.

6. The organic light emitting device according to claim 4, wherein appearances of the substrate and the connect electrode are the same, and respective edges of the connect electrode are parallel with corresponding edges of the substrate.

7. The organic light emitting device according to claim 4, wherein both the first and the second organic light emitting elements comprise a first electrode, a second electrode and a coupling electrode, and the first electrode, the second electrode and the coupling electrode are electrically connected in sequence to form a circuit, and the first electrodes of the first and the second organic light emitting elements are employed to be anodes of the first and the second organic light emitting elements, and the coupling electrodes of the first and the second organic light emitting elements are employed to be cathodes of the first and the second organic light emitting elements.

8. The organic light emitting device according to claim 7, wherein the first electrode comprises a first connect terminal which is extendable, and the coupling electrode comprises a second connect terminal which is extendable, and the anodes of the first and the second organic light emitting elements are connected to the anodes of the second pair of the electrodes via the first connect terminal, and the cathodes of the first and the second organic light emitting elements are connected to the cathodes of the third pair of electrodes via the second connect terminal.

9. The organic light emitting device according to claim 8, wherein the first and the second connect terminals are forms of wire with cover, metal plate or metal belt.

10. The organic light emitting device according to claim 4, wherein the power supply is a constant current driver.

* * * * *